(12) United States Patent
Schmauser et al.

(10) Patent No.: US 6,799,745 B2
(45) Date of Patent: Oct. 5, 2004

(54) PIEZOELECTRIC ACTUATOR

(75) Inventors: Erik M. Schmauser, Schwabach (DE); Till M. Schmauser, Nuremberg (DE); Bernhard Dollgast, Erlangen (DE)

(73) Assignee: Caterpillar Inc, Peoria, IL (US)

( * ) Notice: Subject to any disclaimer, the term of this patent is extended or adjusted under 35 U.S.C. 154(b) by 0 days.

(21) Appl. No.: 10/066,471

(22) Filed: Jan. 31, 2002

(65) Prior Publication Data

US 2002/0179873 A1 Dec. 5, 2002

Related U.S. Application Data

(60) Provisional application No. 60/265,753, filed on Jan. 31, 2001.

(51) Int. Cl.[7] ............................................. F16K 31/02
(52) U.S. Cl. .................. 251/129.06; 310/367; 310/369
(58) Field of Search ............... 251/129.06; 137/625.25; 310/328, 311, 367, 369

(56) References Cited

U.S. PATENT DOCUMENTS 3,588,552 A * 6/1971 Schafft ....................... 310/334
5,628,411 A 5/1997 Mills et al.
6,450,204 B2 * 9/2002 Itzhaky ....................... 137/883

FOREIGN PATENT DOCUMENTS

| DE | 36 08 550 A1 | 9/1987 |
|----|--------------|--------|
| DE | 197 20 849 A1 | 1/1998 |
| EP | 0 922 893 A1 | 6/1999 |

OTHER PUBLICATIONS

Patent Abstracts of Japan vol. 009, No. 206 (M–406) and 60–065970, of Apr. 15, 1985, Shiyouketsu Kinzoku Kogyo KK.

* cited by examiner

*Primary Examiner*—Edward K. Look
*Assistant Examiner*—John K. Fristoe, Jr.

(57) ABSTRACT

A piezoelectric actuator includes a piezoelectric bending transducer, the first end of the bending transducer may be pivoted, while its second end, which is opposite to the first end, may be movably supported in a longitudinal transducer direction. Given a simultaneously large deflection path or bending lift, the actuator may attain a high restoring or working force. Thus, in the case of a valve piezoelectrically actuated by such an actuator, the sealing effect of a valve channel, which is closed or to be closed, may be significantly increased.

20 Claims, 3 Drawing Sheets

PIEZOELECTRIC ACTUATOR

RELATED APPLICATIONS

This application claims the benefit of priority afforded by U.S. Provisional Patent Application Ser. No. 60/265,753, entitled "Piezoelektrischer Aktor (Piezoelectric Actuator)", filed on Jan. 31, 2001, to Schmauser et al., the disclosure of which is incorporated herein by reference in its entirety.

FIELD OF THE INVENTION

The present invention relates to a piezoelectric actuator having a piezoelectric bending (or flexural) transducer. The present invention further relates to a valve that is actuatable by such an actuator.

BACKGROUND INFORMATION

When using such actuators, the piezoelectric bending transducer is fixedly clamped either only at one end or at both ends. Thus, a valve that is able to be used as a pneumatic or hydraulic valve is known, for example, the reference German Patent Application No. DE 36 08 550 purportedly concerns a piezoelectric bending transducer fixed at its connection end, which is used for connecting to an electrical voltage source, inside a valve housing, in a narrow side of the housing, while the opposite, unattached end of the bending transducer, which bears a sealing element for closing a valve channel, is projected into the inside of the housing.

In contrast, the reference U.S. Pat. No. 5,630,440 purportedly concerns a piezoelectrically actuated valve having a bending transducer that is clamped at both ends in the housing and consequently is fixed at both ends. By fixing both ends of the bending transducer, only a minimal and consequently insufficient deflection path, bending or flexural lift may be effected. In comparison to a configuration where only one end of the bending transducer is fixed, this may achieve a comparably high restoring or working force.

SUMMARY OF THE INVENTION

Embodiments according to the present invention are directed to providing a piezoelectric actuator that functions as reliably and effectively as possible during normal operation. Further embodiments according to the present invention are directed to providing a valve, such as a pneumatic valve, that may be operable in an especially reliable manner using such an actuator.

Another exemplary embodiment of the present invention is directed to providing that the first end of the bending transducer, which may be plate-like and/or rectangular, may be supported in a rotatable fashion, while the opposite, second end may be guided so as to be movable in the longitudinal transducer direction. The reversibility of the piezoelectric effect may allow this arrangement to be usable as a sensor as well.

The transverse guidance of the one transducer side or of the one transducer end may render possible a longitudinal movement of the bending transducer when transitioning from the rest state to the energized state. At the same time, rotatably retaining the opposite transducer end (or the opposite transducer side) may prevent a counter-torque, which, otherwise, may inevitably occur as a result of the normal excitation of the bending transducer when this transducer end is securely clamped and consequently immovably fixed and which may cause the transducer material to break.

In another exemplary embodiment of the present invention, the piezoelectric bending transducer may be guided, at least at the rotatably secured transducer end or may also be at both ends of the transducer, in a cylindrical holding element and securely joined thereto. In this context, the holding element provided at the rotationally fixed or retained fixing end of the bending transducer may be embedded in a suitably round or circular receiving groove that wraps around the cylindrical retaining (or holding) element, for example, around more than half of the cross-sectional area, i.e., more than 180°. This receiving groove, or a housing groove, may extend over the entire length of the cylindrical holding element. The appropriate receiving (or housing) groove may also wrap around the holding element only locally, for example, only in the center and/or outer region. The rotatably retained transducer end may be designed as a connection end that may be connected to an electrical voltage source for activating the actuator or transducer.

Analogously, in another exemplary embodiment of the present invention, with respect to the deflection direction of the bending transducer, the holding element provided at the transversely displaceable end of the bending transducer may be inserted over its entire axial length or only partially in an appropriate, for example, approximately U-shaped receiving (or housing) groove.

According to exemplary embodiments of the present invention, a valve having such a piezoelectric actuator may reliably close the valve channel to be blocked and, thus may be deactivated, even under extreme operating conditions, for example, under high pressure and high flow velocities of a medium flow to be controlled, by increasing the force, while at the same time, achieving a greatest possible deflection path or bending range. This increased pressure force or pressing force with which the sealing element may be pressed or pushed by the piezoelectric bending transducer of the actuator against the valve seat of the corresponding valve channel may be generated by the bending transducer itself, while accompanied by a simultaneously sufficient deflection path, since according to the present invention, the bending transducer is held at both ends inside of the valve housing, yet is only stationary at one transducer end, while the other transducer end is practically float-mounted and is, consequently, only supported in the manner of a counter support. As a result, on the whole, the operational performance of the actuator as such and in its use for actuating a valve may be improved, and the operational reliability of the valve may be enhanced.

In this context, exemplary embodiments of the present invention may be based on the knowledge that in the case of a given supply voltage or operating voltage and, therefore, of a constant flexural torque of the piezoelectric transducer, the force generated by the transducer may increase with decreasing lever arm. Thus, if the bending transducer is fixed on both sides, the deflection force, which is exerted by the bending transducer as a result of a deflection of the bending transducer, and which acts as a pressing force exerted by the sealing element against the valve seat of the corresponding valve channel, may be significantly greater than that of a bending transducer clamped on one-side and having a free-moving unattached end. If in this context, a transducer end is guided in an axially movable manner, the deflection path may be at the same time greater than in the case of a bending transducer fixed on both sides. Moreover, in comparison with clamping this transducer end to immovably fix it, securing the fixed transducer end in a rotatable manner may prevent a corresponding counter-torque and, thus, may prevent the bending transducer from rupturing at this fixed end.

In exemplary embodiments of the present invention, the bending transducer may be designed to be bent in the off-circuit state. For the valve control, this deflection or curvature may be concave in the direction of the valve channel. In other words, to control the valve, this deflection or curvature may be orientated toward the channel that is to be deactivated and closed in the rest state. As a result, the valve channel is able to be reliably closed in a particularly simple and effective manner already in the initial state or the rest state. Two such actuators having two appropriate bending transducers held in such a manner and arranged to run essentially in a parallel direction with respect to one another may also be provided inside of the valve housing.

The bending characteristic of the bending transducer in the off-circuit or de-energized rest state may be achieved in that the bending transducer itself is prestressed or biased in the manner of a flat spring. Such prestressing may be achieved in turn using a suitable manufacturing method. In this context, a laminated bending transducer having a layer construction including at least one electrically conductive carrier layer and one piezoceramic layer is used as a baseline, heating and subsequent cooling of the layer construction resulting in layers prestressed to different extents due to different, material-dependent contraction properties. The prestressing of the layers to different extents then results in a deflection of the flat bending transducer about a neutral axis (or a bending axis) that runs perpendicularly to the bending transducer's longitudinal sides and parallelly to its narrow sides.

According to exemplary embodiments of the present invention, an actuator, whose curved and prestressed piezoelectric bending transducer may be float-mounted at one transducer end and pivoted at the opposite transducer end, may be used to achieve a long deflection path or large bending lift and a particularly high restoring force or working force, while simultaneously having a long service life and reliable operational performance. Thus, in the case of a valve piezoelectrically actuated by such an actuator, the sealing effect of a valve channel that is closed or is to be closed may be more effective such that the operational reliability of the valve may be significantly increased.

DETAILED DESCRIPTION

Figure 1:
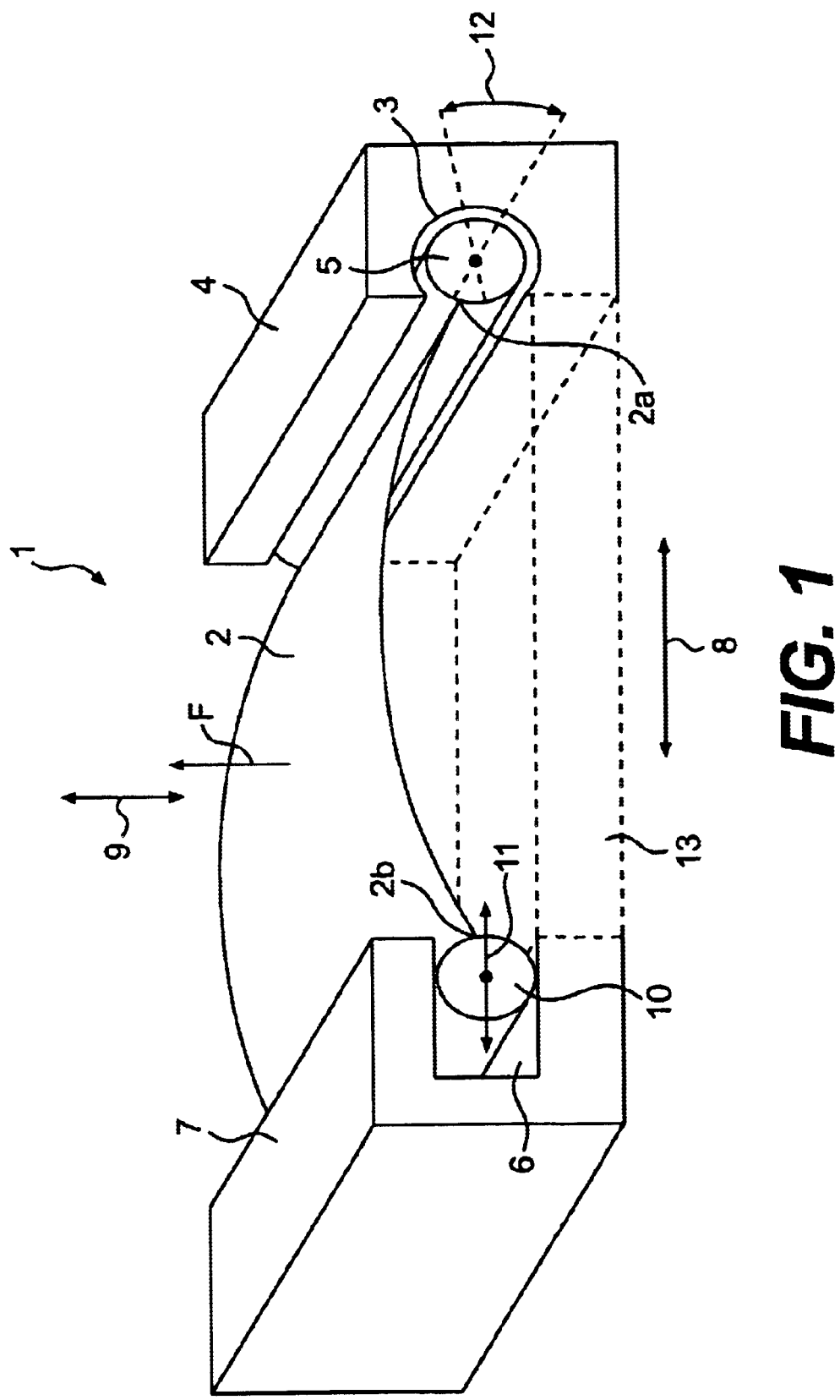
FIG. 1 shows a perspective view of an exemplary embodiment of a piezoelectric actuator of the present invention having a bending transducer held on both sides in receiving grooves.

FIG. 1 shows a piezoelectric actuator 1 having a plate-shaped, for example, rectangular, bending transducer 2 including a connection end 2a and a free end 2b. Connection end 2a of bending transducer 2, which is referred to as the first transducer end in the following, is pivoted in an approximately circular receiving groove 3 of a housing block 4. For this purpose, bending transducer 2 bears at this transducer end 2a a (first) cylindrical retaining element 5, whose circumference is not completely encompassed by receiving groove 3, but preferably by more to 180°. Terminal contacts, which are connected by leads to a voltage source for activating bending transducer 2 and, as such, actuator 1, may be supported at this transducer end 2a in a manner not more closely represented.

Opposite (second) transducer end 2b is held in an approximately U-shaped receiving groove 6 of an additional housing block 7 and is supported there so as to be displaceable in longitudinal transducer direction 8. This second transducer end 2b is, thus, supported so as to be displaceable in a direction transverse to deflection direction 9, which runs in the direction of working force F of bending transducer 2. At this transducer end 2b, bending transducer 2 also bears a (second) cylindrical retaining element 10, which is, in practice, float-mounted, with respect to longitudinal transducer direction 8, in receiving groove 6, which forms an upper and lower stop. Instead of a cylindrical retaining element 5, 10, an impression or indentation of a middle sheet or plate of bending transducer 2 in the manner of a crimp may be provide as the retaining element. In this context, a torque-free, longitudinally displaceable retaining action is useful.

During normal operation of actuator 1 and, as such, in an energized state of bending transducer 2, the transducer may move in deflection direction 9, left (second) transducer end 2b in FIG. 1 being able to move along arrow direction 11 in longitudinal transducer direction 8, inside receiving groove 6. At the same time, right (first) transducer end 2a, which is pivoted in receiving groove 3, may rotate in arrow direction 12. Activating bending transducer 2 causes its curvature or convexity to increase or decrease. The rotatable mounting of transducer end 2a and the transversely displaceable mounting of transducer end 2b enable transducer 2 to adapt to the new curvature without internal stresses being formed in the supports or cutouts or receiving grooves. 3, 6 or counter-torque being produced in cutout 3. Even given the working force F, internal stresses or counter-torques may not be produced or at least are minimized in exemplary embodiment(s) of the present invention using the cutouts or receiving grooves 3, 6. Working force F may be tapped off in the middle region of bending transducer 2, since it is greatest in the center of the bending transducer as a result of bending transducer 2 being held on both sides.

As shown by a dotted line, both housing blocks 4, 7 may also be designed as a housing unit. For this purpose, both housing blocks 4 and 7 may be connected to one another via a bar-like housing segment 13 on the underside of the housing in relation to which bending transducer 2 is convexly bent or curved. The represented bending or curvature characteristic of bending transducer 2 may be achieved by a special manufacturing method in which a layer construction having an electrically conductive carrier layer, for example, in the form of a flat sheet-metal strip, and having a piezoceramic layer adhered thereto is prestressed along longitudinal transducer direction 8 by heating and subsequent cooling.

Figure 2:
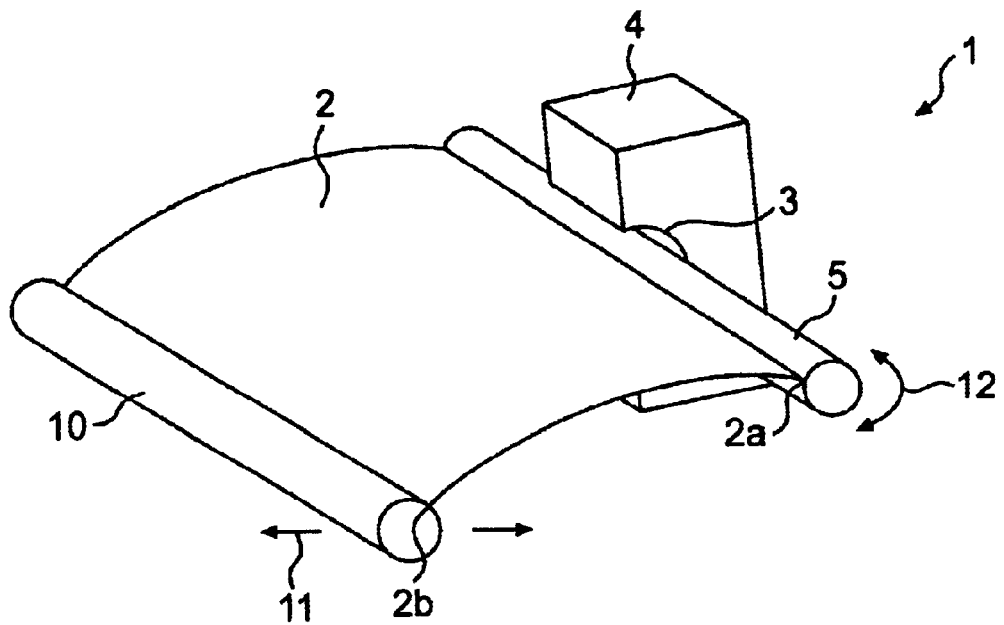
FIG. 2 shows a representation according to FIG. 1 of a bending transducer locally supported at one pivoted transducer end according to an exemplary embodiment of the present invention.

In the exemplary embodiment of the present invention according to FIG. 2, receiving groove 3 extends only over a portion of the axial length of cylindrical retaining element 5 at pivoted transducer end 2a. For this purpose, housing block 4 has an accordingly smaller design than the exemplary embodiment of the present invention according to FIG. 1. Instead of an individual housing block 4 having a receiving groove 3 surrounding cylindrical retaining element 5 at rotatable transducer end 2a approximately in the middle region, two such housing blocks 4 may also be provided whose receiving grooves 3 then encompass retaining element 5 in the region of its two ends. As in the exemplary embodiment of the present invention according to FIG. 1, the, or every, locally active housing block 4 may have a circular or round receiving groove 3, which is circumferentially not completely closed, bending transducer 2 emerging from the receiving groove's opening side.

Figure 3:
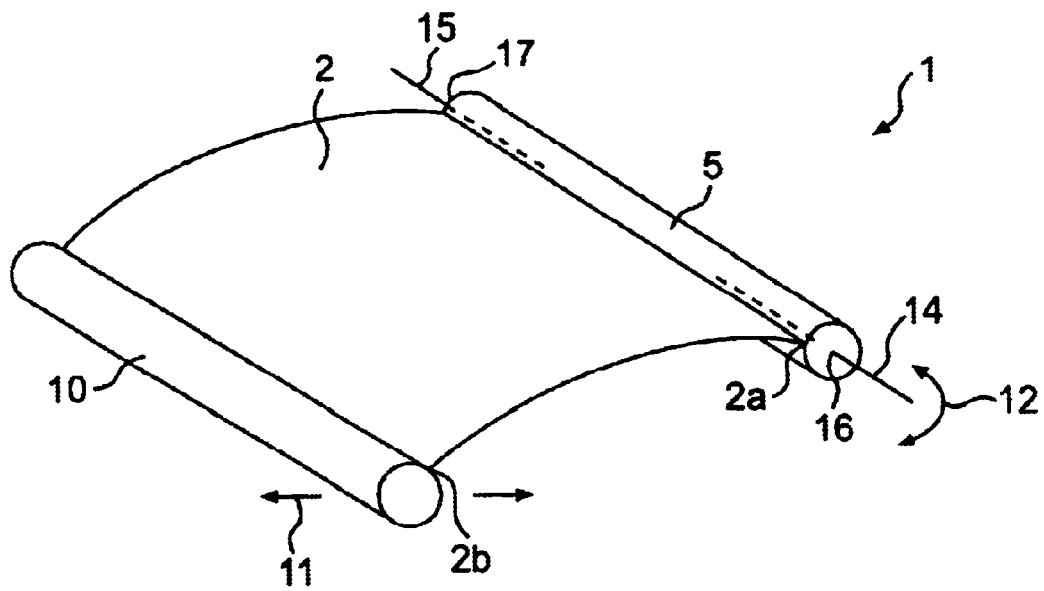
FIG. 3 shows a bending transducer according to FIG. 2 having a transducer end held via an axis of rotation according to an exemplary embodiment of the present invention.

According to the exemplary embodiment of the present invention according to FIG. 3, a rotational mount of cylindrical retaining element 5 provided at rotatable transducer end 2a is provided in the form of a shaft. For this purpose, two rotating shafts or shaft extensions 14, 15 engage on the end faces with corresponding bore holes 16 and 17, respectively, of cylindrical retaining element 5. The two shaft extensions 14, 15 then support, in a manner not shown in greater detail, the plus and minus poles, respectively, of a control electronics for controlling piezoelectric actuator 1.

Figure 4:
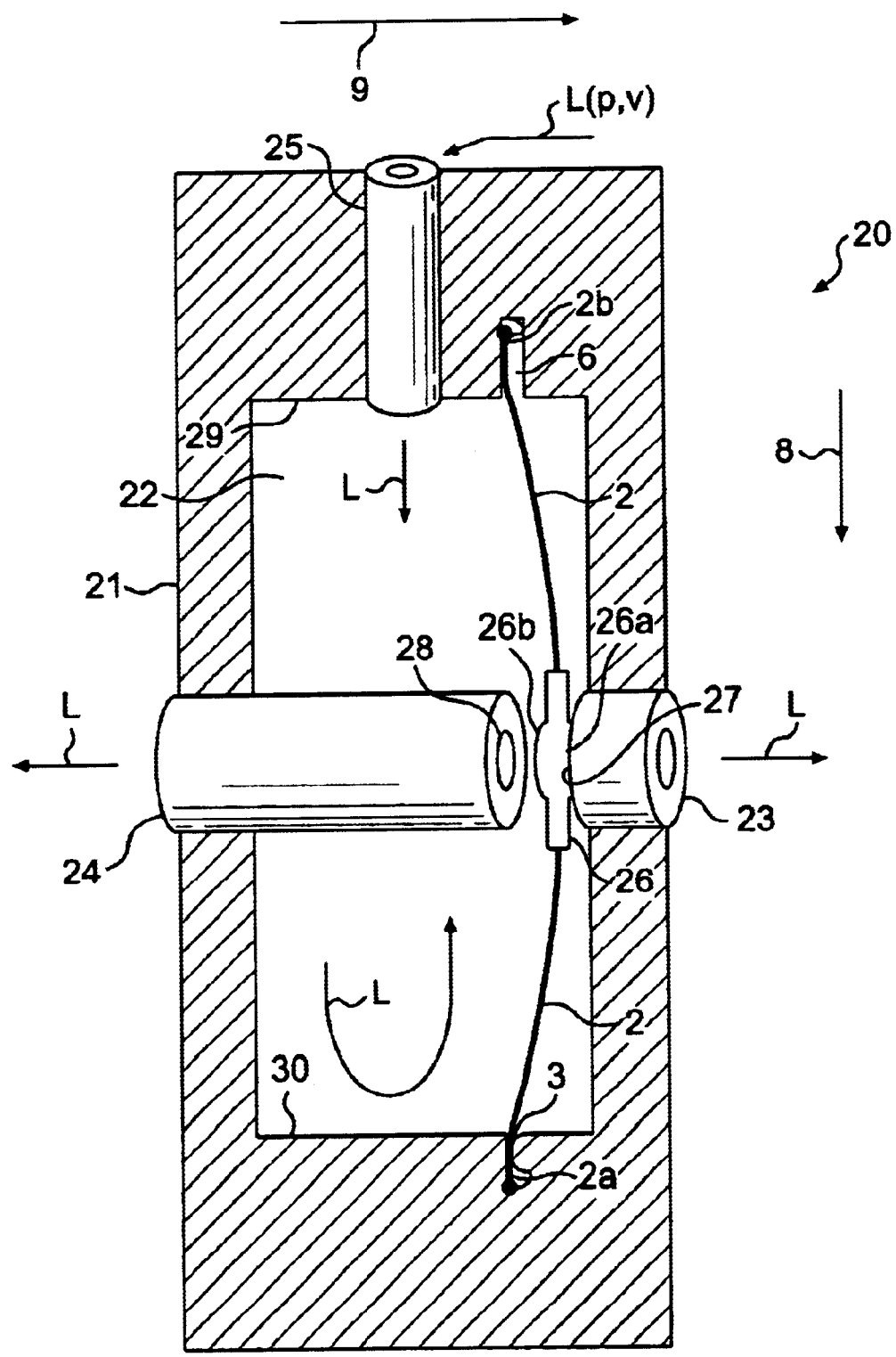
FIG. 4 shows a sectional view of a valve having an actuator according to an exemplary embodiment of the present invention.

FIG. 4 shows a valve 20, which is actuated by such a piezoelectric actuator 1 and, for example, has a plastic and rectangular valve housing 21 having a likewise rectangular or even circular-cylindrical interior 22. Two diametrically opposed valve channels 23 and 24 lead into interior space 22. In an exemplary embodiment of the present invention, an additional valve channel or input channel 25, which empties into interior space 22 of valve housing 21, runs perpendicularly (or transversely) with respect to both valve channels 23 and 24.

In the case of valve 20, which is represented without voltage connections, bending transducer 2 is in turn supported on both sides in valve housing 21. In this context, retaining element 5 of transducer end 2a, which has a circular cross-section and is fixed to the transducer end, is pivoted in a corresponding receiving or housing groove 3, while opposite transducer end 2b is in turn supported in a corresponding receiving or housing groove 6 so as to be longitudinally displaceable, i.e., displaceable in longitudinal transducer direction 8 or transversely displaceable and, therefore, float-mounted. In an exemplary embodiment of the present invention, this transducer end 2b may be inserted directly, i.e., without an additional retaining element, into housing groove 6. In this instance, transducer end 2b is minimally bent up in such a manner that it runs at least approximately parallel to the groove walls of housing groove 6, which in turn is almost U-shaped.

In a further exemplary embodiment of the present invention, the center region of bending transducer 2 is curved or bent in the rest state, in the direction of valve channel 23. In this center region, a sealing element 26, which may be designed to be curved on both sides and be effective on the convex as well as the concave side of bending transducer 2, may be placed or slid onto bending transducer 2. In this context, mutually opposing sealing convexities or bulges 26a, 26b may have a hemispherical shape. As a result, a particularly reliable sealing effect can be achieved, in particular, even in the case of a comparatively narrow internal width or a comparably small inner diameter of valve channels 23, 24. Valve channel 24, which is opposite valve channel 23, may be extended in housing interior 22 in the direction of sealing element 26 and, thus, may extend into the effective vicinity of bending transducer 2.

When pneumatic valve 20, which is designed as a three-way valve in a further exemplary embodiment of the present invention, is in operation, sealing element 26 is pressed against valve seat 27 by off-circuit and, consequently, de-energized bending transducer 2, thereby closing valve channel 23 while valve channel 24 is open. Working or pressing force F needed for this purpose may be exerted by bending transducer 2 itself in that it is concavely curved in the direction of valve seat 27 in the rest state and is also prestressed in the manner of a flat spring as a result of an appropriate installation position. By reversing the polarity of the voltage, for example, of a d.c. voltage of 200V, valve channel 24 may be closed and valve channel 23 may be simultaneously opened as a result of bending transducer 2 bending in a direction opposite to represented bending direction 9 and pressing sealing element 26 onto valve seat 28.

Air L, which flows via the inlet or intake channel 25 into valve housing 21 at a predefined pressure p and a predefined flow velocity v, may be discharged from valve housing 21 via valve channel 24, which is open in this off-circuit rest state. Intake channel 25 empties into interior space 22 via housing side or narrow side 29 of valve housing 21, which may be provided with oblong housing groove 6 for transducer end 2b, which is supported in a transversely movable manner. Intake channel 25 may also be guided into interior 22 of the valve housing via opposite housing side or narrow side 30 of valve housing 21, which may be provided with round housing groove 3 for pivoted transducer end 2a. Air L, which flows via intake channel 25 into valve housing 21, may be discharged via valve channel 24 or, using appropriate polarity of the voltage source, via valve channel 23.

In comparison with a piezoelement or bending transducer clamped on one end, the configuration of bending transducer 2 of the present invention supported at both ends inside of a consequently piezoelectrically operated valve 20 may significantly increase force F for closing valve channels 23 and 24, respectively. While the prestressing of bent bending transducer 2 in the rest state already causes sealing element 26, which is supported by bending transducer 2, to be pressed against valve seat 27 with a sufficiently high pressing force F, the pressing force F necessary to close valve channel 24, which is open in the rest state, is achieved by bending transducer 2 being supported on both sides in combination with sealing element 26 being arranged in a middle position. The reason for this may be an increase in force due to a particularly favorable lever arm effect with a constant flexural torque. Such a rupture joint due to a counter-torque in the region of fixedly held transducer end 2a may be prevented also in this instance as a result of this transducer end 2a being rotatably attached.

What is claimed is:

1. A piezoelectric actuator comprising:
    a bending transducer, the transducer having a first transducer end situated in a rotatable manner and having a second transducer end situated to be movable in a longitudinal direction of the transducer, the second transducer end being situated opposite the first transducer end.

2. The piezoelectric actuator of claim 1, further comprising:
    a first cylindrical retaining element, the first cylindrical retaining element being at least partially surrounded on a first peripheral side by a first receiving groove, the first cylindrical retaining element being provided at the first transducer end.

3. The piezoelectric actuator of claim 2, further comprising:
    a second cylindrical retaining element, the second cylindrical retaining element being received by a second receiving groove in a transversely displaceable manner with respect to deflection direction of the transducer, the second cylindrical retaining element being provided at the second transducer end.

4. The piezoelectric actuator of claim 3, wherein the first transducer end is configured as a connection end of the transducer so that the connection end is connectable to an electrical voltage source to activate the bending transducer.

5. The piezoelectric actuator of claim 3, wherein the second cylindrical retaining element is float-mounted in the second receiving groove with respect to the longitudinal transducer direction and forms an upper and a lower stop at the second receiving groove.

6. The piezoelectric actuator of claim 5, wherein the first receiving groove is approximately circular and the second receiving grove is approximately U-shaped.

7. The piezoelectrically actuatable valve of claim 6, wherein the transducer is rectangular and plate-shaped.

8. The piezoelectric actuator of claim 5, wherein during normal operation the transducer moves in a deflection direction, and any resulting working force is tapped off in a middle region of the transducer.

9. The piezoelectric actuator of claim 1, further comprising:
a cylindrical retaining element, the cylindrical retaining element being received by a receiving groove in a transversely displaceable manner with respect to deflection direction of the transducer, the cylindrical retaining element being provided at the second transducer end.

10. The piezoelectric actuator of claim 1, wherein the first transducer end is configured as a connection end of the transducer so that the connection end is connectable to an electrical voltage source to activate the bending transducer.

11. A method of manufacturing the bending transducer of claim 1, comprising:
providing an electrically conductive carrier layer, the carrier layer being a flat sheet-metal strip;
adhering a piezoceramic layer to the electrically conductive carrier layer; and
prestressing the electrically conductive carrier layer with the piezoceramic layer along a longitudinal transducer direction by heating and subsequent cooling.

12. A piezoelectrically actuatable valve, comprising:
a piezoelectric actuator including:
a bending transducer, the transducer having a first transducer end situated in a rotatable manner and having a second transducer end situated to be movable in a longitudinal direction of the transducer, the second transducer end being situated opposite the first transducer end;
at least one valve channel, the at least one valve channel being configured to be closed with a sealing element and being configured supportable by the transducer;
a valve housing on a housing side;
a first housing groove provided in the valve housing, the first transducer end being rotatably held in the first housing groove;
a second housing groove provided in the valve housing, the second transducer end being guided so that the second transducer end is movable in a longitudinal transducer direction in the second housing groove, the second transducer end being situated opposite the first transducer end.

13. The piezoelectrically actuatable valve of claim 12, wherein the piezoelectric actuator further includes:
a first cylindrical retaining element, the first cylindrical retaining element being at least partially surrounded on a first peripheral side by a first receiving groove, the first cylindrical retaining element being provided at the first transducer end, and
a second cylindrical retaining element, the second cylindrical retaining element being received by a second receiving groove in a transversely displaceable manner with respect to deflection direction of the transducer, the second cylindrical retaining element being provided at the second transducer end,
wherein the first transducer end is configured as a connection end of the transducer so that the connection end is connectable to an electrical voltage source to activate the bending transducer.

14. The piezoelectrically actuatable valve of claim 13, further comprising:
another sealing element, wherein the another sealing element is situated in a middle region of the transducer and is effective on both sides of the middle region of the transducer, the another sealing element including at least one sealing convexity directed at at least one of the first valve channel and the second valve channel.

15. The piezoelectrically actuatable valve of claim 12, wherein the bending transducer is concavely bent in the direction of a first valve channel in a off-circuit state.

16. The piezoelectrically actuatable valve of claim 15, further comprising a second valve channel, the second valve channel extending within the valve housing into an effective vicinity of the transducer.

17. The piezoelectrically actuatable valve of claim 12, wherein another sealing element is situated in a middle region of the transducer.

18. The piezoelectrically actuatable valve of claim 17, wherein the another sealing element is effective on both sides of the middle region of the transducer.

19. The piezoelectrically actuatable valve of claim 18, wherein the another sealing element includes at least one sealing convexity directed at at least one of the first valve channel and the second valve channel.

20. The piezoelectrically actuatable valve of claim 17, wherein the another sealing element includes at least one sealing convexity directed at at least one of the first valve channel and the second valve channel.

* * * * *

UNITED STATES PATENT AND TRADEMARK OFFICE
CERTIFICATE OF CORRECTION

PATENT NO. : 6,799,745 B2
DATED : October 5, 2004
INVENTOR(S) : Erik M. Schmauser et al.

It is certified that error appears in the above-identified patent and that said Letters Patent is hereby corrected as shown below:

Column 6,
Line 49, insert -- , -- after "actuator"

Column 7,
Line 16, delete "grove" and insert -- groove --

Signed and Sealed this

First Day of March, 2005

JON W. DUDAS
*Director of the United States Patent and Trademark Office*